(12) United States Patent
Lung

(10) Patent No.: US 8,610,098 B2
(45) Date of Patent: Dec. 17, 2013

(54) PHASE CHANGE MEMORY BRIDGE CELL WITH DIODE ISOLATION DEVICE

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 992 days.

(21) Appl. No.: 11/697,492

(22) Filed: Apr. 6, 2007

(65) Prior Publication Data

US 2008/0247224 A1 Oct. 9, 2008

(51) Int. Cl.
*H01L 29/02* (2006.01)

(52) U.S. Cl.
USPC ............... 257/2; 257/5; 257/41; 257/E45.003

(58) Field of Classification Search
USPC .......... 257/295, 296, E21.045, E31.029, 2, 5, 257/E45.003; 438/102, 129
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,017,508 A * | 5/1991 | Dodt et al. ............ 438/139 |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Stephens, Jr. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |

(Continued)

FOREIGN PATENT DOCUMENTS

| | | |
|---|---|---|
| WO | 0079539 | 12/2000 |
| WO | 0145108 | 6/2001 |

OTHER PUBLICATIONS

Adler, David, "Amorphous-Semiconductor Devices," Sci. Amer., vol. 236, pp. 36-48, May 1977.

(Continued)

*Primary Examiner* — Robert Huber
(74) *Attorney, Agent, or Firm* — James F. Hann; Haynes Beffel & Wolfeld LLP

(57) ABSTRACT

Memory cells are described along with arrays and methods for manufacturing. An embodiment of a memory cell as described herein includes a second doped semiconductor region on a first doped semiconductor region and defining a pn junction therebetween. A first electrode on the second doped semiconductor region. An insulating member between the first electrode and a second electrode, the insulating member having a thickness between the first and second electrodes. A bridge of memory material across the insulating member, the bridge having a bottom surface and contacting the first and second electrodes on the bottom surface, and defining an inter-electrode path between the first and second electrodes across the insulating member, the inter-electrode path having a path length defined by the thickness of the insulating member, wherein the memory material has at least two solid phases.

27 Claims, 11 Drawing Sheets

100

(56) References Cited

U.S. PATENT DOCUMENTS

| | | |
|---|---|---|
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,066,870 A | 5/2000 | Siek |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 * | 5/2003 | Harshfield .................... 257/296 |
| 6,566,700 B2 | 5/2003 | Xu |
| 6,567,293 B1 | 5/2003 | Lowrey et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi et al. |
| 6,808,991 B1 | 10/2004 | Tung et al. |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,305 B2 * | 5/2005 | Yi et al. ............................ 257/4 |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,972,430 B2 | 12/2005 | Casagrande et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,053,431 B2 * | 5/2006 | Ogiwara ........................ 257/295 |
| 7,067,864 B2 | 6/2006 | Nishida et al. |
| 7,067,865 B2 | 6/2006 | Lung et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 7,277,317 B2 | 10/2007 | Le Phan et al. |
| 2001/0055838 A1 | 12/2001 | Walker et al. |
| 2002/0081833 A1 | 6/2002 | Li et al. |
| 2002/0182835 A1 | 12/2002 | Quinn |
| 2003/0073262 A1 * | 4/2003 | Xu et al. ........................ 438/102 |
| 2004/0051094 A1 | 3/2004 | Ooishi |
| 2004/0166604 A1 * | 8/2004 | Ha et al. ........................ 438/102 |
| 2005/0029502 A1 | 2/2005 | Hudgens |
| 2005/0093022 A1 | 5/2005 | Lung |
| 2005/0124157 A1 * | 6/2005 | Lowrey et al. ................ 438/680 |
| 2005/0167656 A1 | 8/2005 | Sun et al. |
| 2005/0201182 A1 | 9/2005 | Osada et al. |
| 2005/0212024 A1 | 9/2005 | Happ |
| 2005/0215009 A1 | 9/2005 | Cho |
| 2005/0270832 A1 * | 12/2005 | Chu et al. ...................... 365/163 |
| 2006/0043617 A1 | 3/2006 | Abbott |
| 2006/0108667 A1 | 5/2006 | Lung |
| 2006/0110878 A1 | 5/2006 | Lung et al. |
| 2006/0118913 A1 | 6/2006 | Yi et al. |
| 2006/0154185 A1 | 7/2006 | Ho et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0037101 A1 | 2/2007 | Morioka |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |

(56) References Cited

U.S. PATENT DOCUMENTS

| | | |
|---|---|---|
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0224726 A1 | 9/2007 | Chen et al. |
| 2007/0246699 A1 | 10/2007 | Lung |
| 2007/0257300 A1 | 11/2007 | Ho et al. |
| 2007/0262388 A1 | 11/2007 | Ho et al. |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Non-volatile Memory Technology," MRS Bulletin, Nov. 2004, pp. 829-832.

Hwang, Y. N. et al., "Full Integration and Reliability Evaluation of Phase-change RAM Based on 0.24?m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martin H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org <http://www.sciencenews.org>, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

"Optimized Thermal Capacitance in a Phase Change Memory Cell Design", IPCOM000141986D, IP.com Prior Art Database, Oct. 18, 2006, 4 pp.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel ?Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile%20high%20density%20high%20performance%20phase%20change%20memory <http://klabs.org/richcontent/MAPLDCon99/Papers/P21_Tyson_P.PDF#search='nonvolatile%20high%20density%20high%20performance%20phase%20change%20memory>', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

(56) References Cited

OTHER PUBLICATIONS

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

\* cited by examiner

PHASE CHANGE MEMORY BRIDGE CELL WITH DIODE ISOLATION DEVICE

PARTIES TO A JOINT RESEARCH AGREEMENT

International Business Machines Corporation, a New York corporation; Macronix International Corporation, a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

A technology developed by the assignee of the present application is referred to as a phase change bridge cell, in which a very small patch of memory material is formed as a bridge across a thin film insulating member between electrodes. The phase change bridge is easily integrated with logic and other types of circuitry on integrated circuits. See, U.S. application Ser. No. 11/155,067, filed 17 Jun. 2005, entitled "Thin Film Fuse Phase Change RAM and Manufacturing Method," by Lung et al., which application was owned at the time of invention and is currently owned by the same assignee.

Problems have arisen in manufacturing such devices with very small dimensions, and with variations in process that meet tight specifications needed for large-scale memory devices. It is desirable therefore to provide a memory cell structure with an array architecture supporting high-density devices, and a method for manufacturing such structure that meets tight process variation specifications needed for large-scale memory devices. Furthermore, it is desirable to produce memory devices having a small active phase change region.

SUMMARY OF THE INVENTION

An array of memory cells described herein includes a plurality of word lines comprising doped semiconductor material having a first conductivity type, the word lines having word line widths and extending in parallel in a first direction. A plurality of second doped semiconductor regions having a second conductivity type opposite the first conductivity type, second doped semiconductor regions in the plurality of second doped semiconductor regions on corresponding word lines and defining respective pn junctions therebetween. A plurality of electrode pairs, wherein pairs include respective first and second electrodes and an insulating member between the first and second electrodes, the insulating member having a thickness between the first and second electrodes, the first electrodes on corresponding second doped semiconductor regions. An array of bridges of memory material across the insulating members of respective electrode pairs, the bridges having respective bottom surfaces and contacting the first and second electrodes in the respective electrode pairs on the bottom surface, and defining an inter-electrode path between the corresponding first and second electrodes defined by the thickness of the insulating member, wherein the memory material has at least two solid phases.

In preferred embodiments the memory cells have an area equal to $4F^2$, where F is about one half the sum of the word line width and the separation distance between adjacent word lines, typically about the minimum feature size for a lithographic process used in manufacturing the memory cells.

A method for manufacturing an array of memory cells as described herein comprises forming a plurality of word lines comprising doped semiconductor material having a first conductivity type, the word lines having word line widths and extending in parallel in a first direction. Forming a plurality of second doped semiconductor regions, having a second conductivity type opposite the first conductivity type, on corresponding word lines and defining respective pn junctions therebetween. Forming a plurality of electrode pairs, wherein pairs include respective first and second electrodes and an insulating member between the first and second electrodes, the insulating member having a thickness between the first and second electrodes, the first electrodes on corresponding second doped semiconductor regions. Forming an array of bridges of memory material across the insulating members of respective electrode pairs, the bridges having respective bottom surfaces and contacting the first and second electrodes in the respective electrode pairs on the bottom surface, and defining an inter-electrode path between the corresponding first and second electrodes defined by the thickness of the insulating member, wherein the memory material has at least two solid phases.

Other aspects and advantages of the invention are described below with reference to the figures.

DETAILED DESCRIPTION

Figure 1:
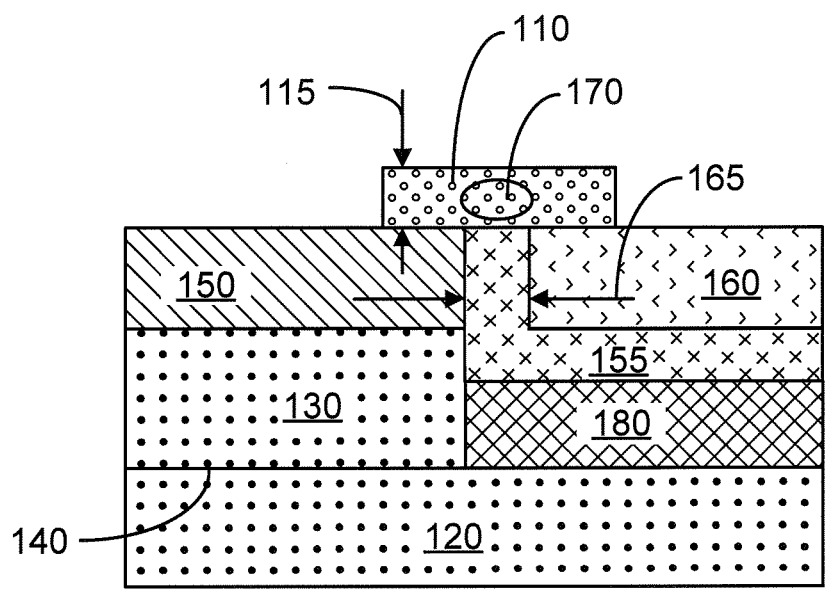
FIG. 1 illustrates a cross-sectional view of a memory cell having a phase change memory bridge in accordance with an embodiment.

The following description of the invention will typically be with reference to specific structural embodiments and methods. It is to understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

A detailed description is provided with reference to FIGS. 1-10.

FIG. 1 illustrates a cross-sectional view of a memory cell 100 having a phase change memory bridge 110 in accordance with an embodiment. FIG. 1 illustrates a first doped semiconductor region 120 having a first conductivity type and a second doped semiconductor region 130 on the first doped semiconductor region 120, the second doped semiconductor region 130 having a second conductivity type opposite the first conductivity type. The interface between the first doped semiconductor region 120 and the second doped semiconductor region 130 defines a pn junction 140. In the illustrated embodiment the first semiconductor region 120 comprises N-type conductivity and the second semiconductor region 130 comprises P-type conductivity. In some alternative embodiments, the first semiconductor region 120 comprises P-type conductivity and the second semiconductor region 130 comprises N-type conductivity. The first and second semiconductor regions 120, 130 in some embodiments comprises a conductivity having a gradient doping. For example, a semiconductor region having N-type conductivity may include $N^+$ and $N^-$ doped regions and a semiconductor region having P-type conductivity may include $P^+$ and $P^-$ doped regions.

A first electrode 150 comprising conductive material is on the second doped semiconductor region 140. An insulating member 155 has a thickness 165 between the first electrode 150 and a conductive second electrode 160. The bridge of memory material 110 is across the insulating member 155 and contacts the first and second electrodes 150,160 on a bottom surface of the bridge 110. In operation, voltages on the first doped semiconductor region 120 and the second electrode 160 can induce current to flow from the first doped semiconductor region 120 to the second electrode 160, or vice-versa, via the second doped semiconductor region 130, the first electrode 150, and the bridge 110 of memory material.

The active region 170 is the region of the bridge 110 in which the memory material is induced to change between at least two solid phases. As can be appreciated the active region 170 can be made extremely small in the illustrated structure, reducing the magnitude of current needed to induce the phase changes. The inter-electrode path length between the first and second electrodes 150, 160 is defined by the thickness 165 of the insulating member. In representative embodiments, the thickness 165 of the insulating member 155 can be established using a thin film deposition technique to form a thin sidewall dielectric on the sidewall of first electrode 150. Likewise, the thickness 115 of the bridge 110 of memory material can be very small. The thickness 115 can be established using a thin film deposition technique of memory material on the top surfaces of the first electrode 150, the insulating member 110, and the second electrode 160.

In the illustrated embodiment a dielectric layer 180 is between the first doped semiconductor region 120 and the insulating member 155. Alternatively, the dielectric layer 180 can be omitted such that the insulating member 155 is on the first doped semiconductor region 120.

Embodiments of the memory cell 100 include phase change based memory materials, including chalcogenide based materials and other materials, for the bridge 110. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$, (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

The following are short summaries describing four types of resistive memory materials.

1. Chalcogenide Material
    $Ge_xSb_yTe_z$
    x:y:z=2:2:5
    Or other compositions with x: 0~5; y: 0~5; z: 0~10
    GeSbTe with doping, such as N—, Si—, Ti—, or other element doping may also be used.
    Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.
    The post deposition annealing treatment with vacuum or N2 ambient is sometimes needed to improve the crystallize state of chalcogenide material. The annealing temperature typically ranges 100 C to 400 C with an anneal time of less than 30 minutes.
    The thickness of chalcogenide material depends on the design of cell structure. In general, a chalcogenide material with thickness of higher than 8 nm can have a phase change characterization so that the material exhibits at least two stable resistance states.
2. CMR (Colossal Magneto Resistance) Material
    $Pr_xCa_yMnO_3$
    x:y=0.5:0.5
    Or other compositions with x: 0~1; y: 0~1
    Another CMR material that includes Mn oxide may be used
    Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.
    The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.
    The thickness of CMR material depends on the design of cell structure. The CMR thickness of 10 nm to 200 nm can be used to be the core material.
    A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.
3. 2-Element Compound
    $Ni_xO_y$; $Ti_xO_y$; $Al_xO_y$; $W_xO_y$; $Zn_xO_y$; $Zr_xO_y$; $Cu_xO_y$; etc
    x:y=0.5:0.5
    Other compositions with x: 0~1; y: 0~1
    Formation method:
    1. Deposition: By PVD sputtering or magnetron-sputtering method with reactive gases of Ar, $N_2$, $O_2$, and/or He, etc. at the pressure of 1 mtorr~100 mtorr, using a target of metal oxide, such as $Ni_xO_y$; $Ti_xO_y$; $Al_xO_y$; $W_xO_y$; $Zn_xO_y$; $Zr^xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.
        The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.
    2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.
        The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.
    3. Oxidation: By a high temperature oxidation system, such as furnace or RTP system. The temperature ranges from 200 C to 700 C with pure $O_2$ or $N_2O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.

The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

An exemplary method for forming chalcogenide material uses the PVD-sputtering or magnetron-sputtering method with source gas(es) of Ar, $N_2$, and/or He, etc. at the pressure of 1 mTorr ~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states. It is expected that some materials are suitable with even lower thicknesses.

Figure 2A:
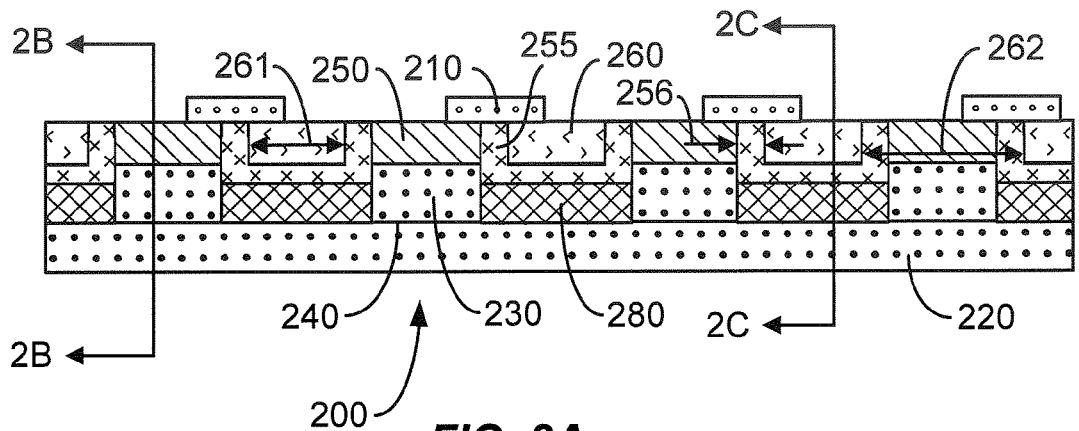
FIGS. 2A through 2C illustrate cross-sectional views of a portion of an array of memory cells in accordance with an embodiment.
Figure 2B:
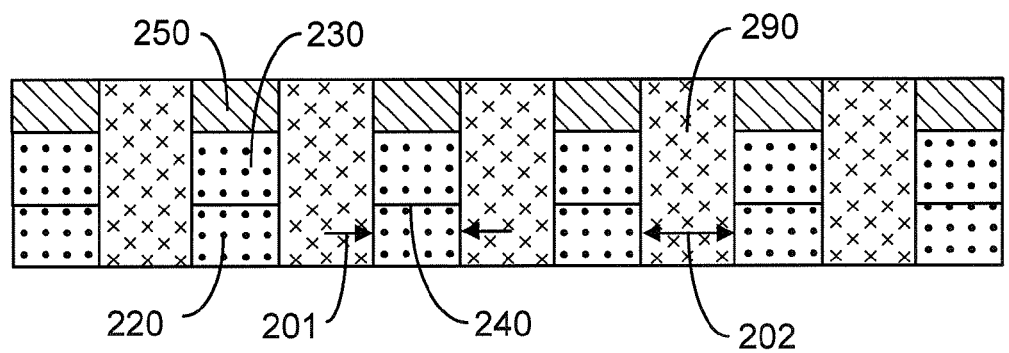
Figure 2C:
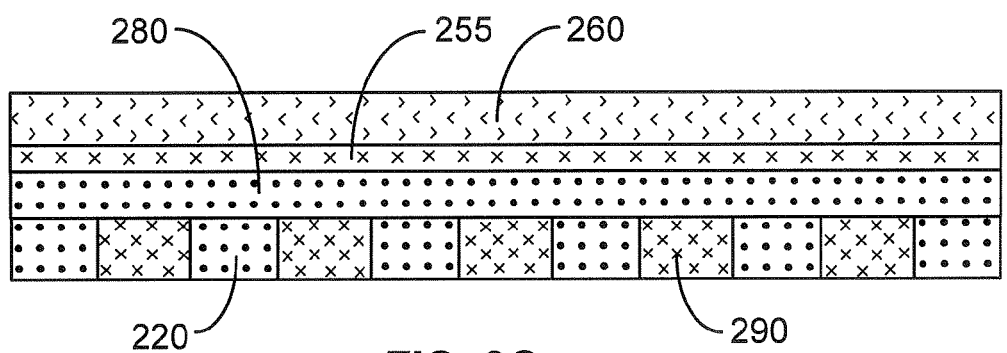

FIGS. 2A-2C are cross-sectional views of a portion of a cross-point array of memory cells in accordance with an embodiment. FIG. 2A is a cross-section taken orthogonal to bit lines 260 and include a plurality of memory cells 200. FIG. 2B and FIG. 2C are cross-sections taken orthogonal to word lines 220.

Word lines 220 extend in parallel in a first direction, the word lines 220 having word line widths 201 and adjacent word lines 220 separated by a word line separation distance 202. The word lines 220 comprise doped semiconductor material having a first conductivity type. Conductive bit lines 260 extend in parallel in a second direction perpendicular to the first direction, the bit lines 260 having bit line widths 261 and adjacent bit lines being separated by a bit line separation distance 262. In the illustrated embodiment the bit lines 260 form the second electrodes of the memory cells 200. Dielectric material 290 is between adjacent word lines 220.

The memory cells 200 include second doped semiconductor regions 230 on the corresponding word line 220 and define respective pn junctions 240 therebetween. The second doped semiconductor regions 230 have a second doped conductivity type opposite the first conductivity type. The memory cells 200 include electrode pairs, the pairs including respective first electrodes 250 and second electrodes (bit lines 260) and an insulating member 255 between the first electrode 250 and the second electrodes (bit lines 260), the first electrodes 250 on the corresponding second doped semiconductor regions 230. The insulating member 255 has a thickness 256 between the first electrodes 250 and the second electrodes (bit lines 260). In the illustrated embodiment dielectric 280 is between the insulating members 255 and the word lines 220. Alternatively, the dielectric 280 can be omitted such that the insulating members 255 are on the corresponding word lines 220.

The memory cells 200 include a bridge 210 of memory material across the insulating member 255. The bridge 210 has a bottom surface and contacts the first electrodes 250 and the second electrodes (bit lines 260) on the bottom surface. An inter-electrode path between the first electrodes 250 and the second electrodes (bit lines 260) has a path length defined by the thickness 256 of the insulating member 255.

The bridges 210 in the illustrated embodiment comprise memory material having at least two solid phases that are reversible, such as chalcogenide material or other related material, by applying a current through the bridge 210 or applying a voltage across the first electrodes 250 and the second electrodes (bit lines 260).

It will be understood that a wide variety of materials can be utilized in implementation of the conductive bit lines 260 and first electrodes 250, including metals such as aluminum, titanium nitride, and tungsten based materials as well as non-metal conductive material such as doped polysilicon. The first electrodes 250 and bit lines 260 in the illustrated embodiment are preferably TiN or TaN. Alternatively, the first electrodes 250 and bit lines 260 are TiAlN or TaAlN, or comprise, for further examples, one or more elements selected from the group consisting of Ti, W, Mo, Al, Ta, Cu, Pt, Ir, La, Ni, and Ru and alloys thereof.

Figure 2D:
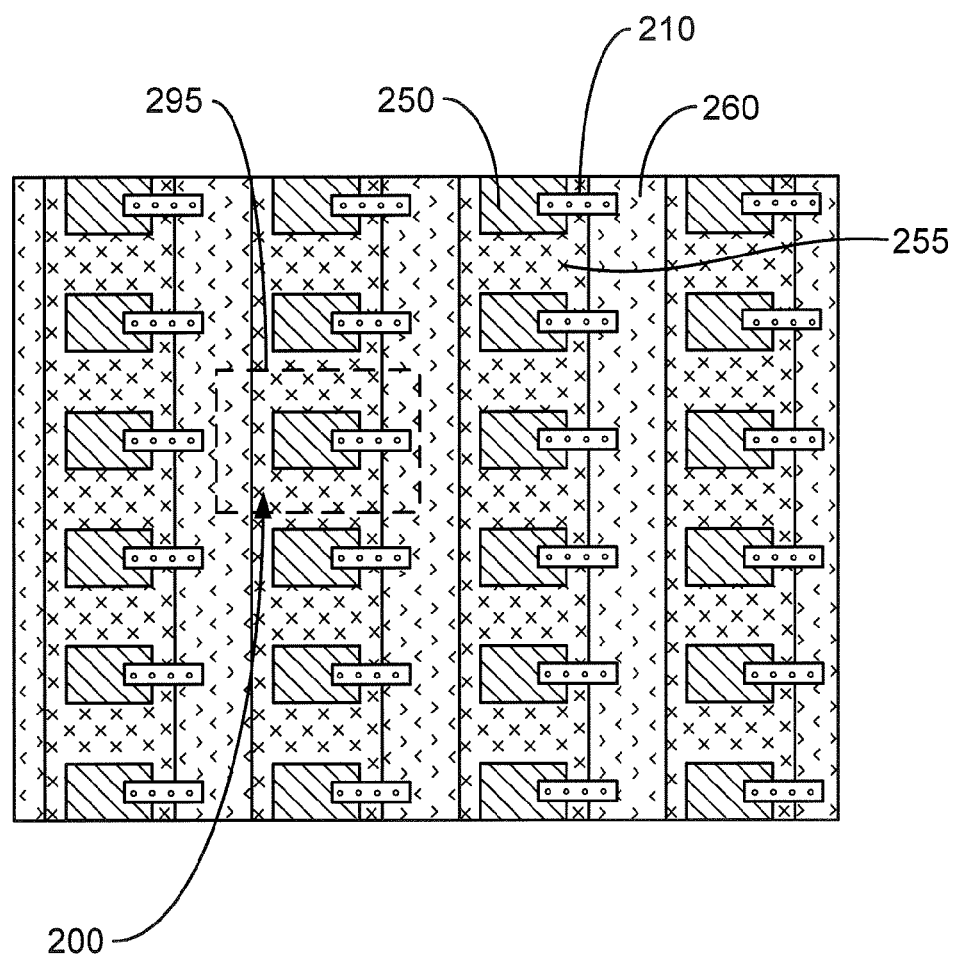
FIG. 2D illustrates a top view of a portion of the memory array of FIGS. 2A-2C.

FIG. 2D is a top view, or plan view, of the array of memory cells 200 illustrated in FIGS. 2A-2C. Memory cells 200 have a memory cell area 295. In preferred embodiments the summation of the bit line width 261 and the bit line separation distance 262 is equal to about twice a feature size F, and F preferably being a minimum feature size for the lithographic process used to create the word lines 220 and bit lines 260; and the summation of the word line width 201 and the word line separation distance 202 is equal to about twice the feature size F, such that the memory cells have an area 295 equal to $4F^2$.

FIGS. 3-10 illustrate an embodiment of a process flow for manufacturing a memory array, utilizing a memory cell as described herein. FIGS. 3A-3B illustrate respective top and cross-sectional views of a multi-layer structure 300 including a first doped semiconductor layer 310, a second doped semiconductor layer 320, and a conductive bottom electrode layer 330. The first and second doped semiconductor layers 310, 320 have respective first and second conductivity types, the first conductivity type opposite the second conductivity type.

Figure 3A:
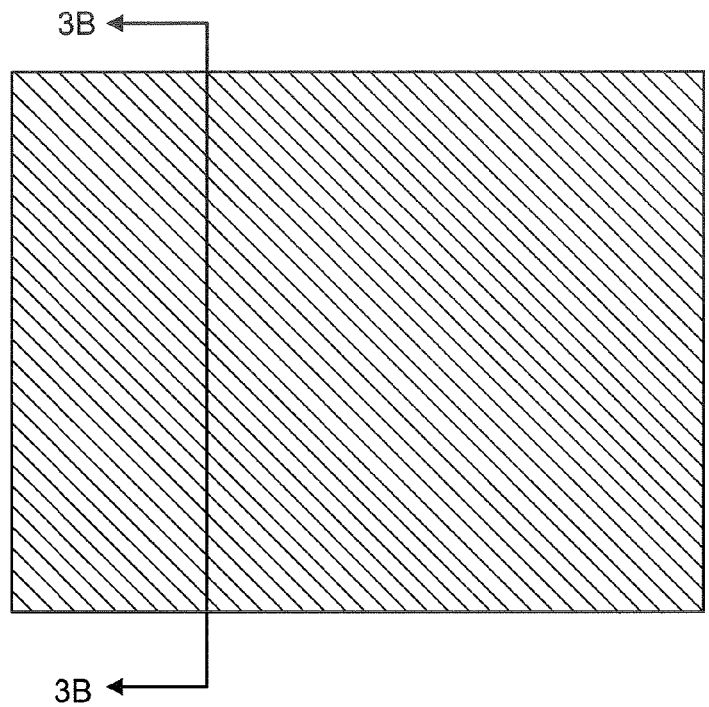
FIGS. 3A through 10C illustrate a fabrication sequence of an array of memory cells in accordance with an embodiment.
Figure 3B:
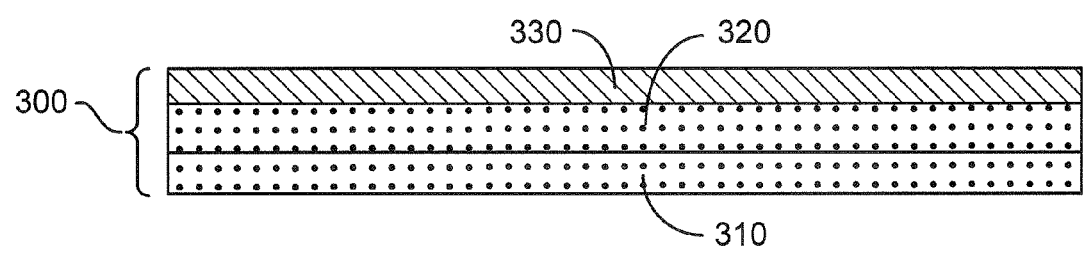
Figure 4A:
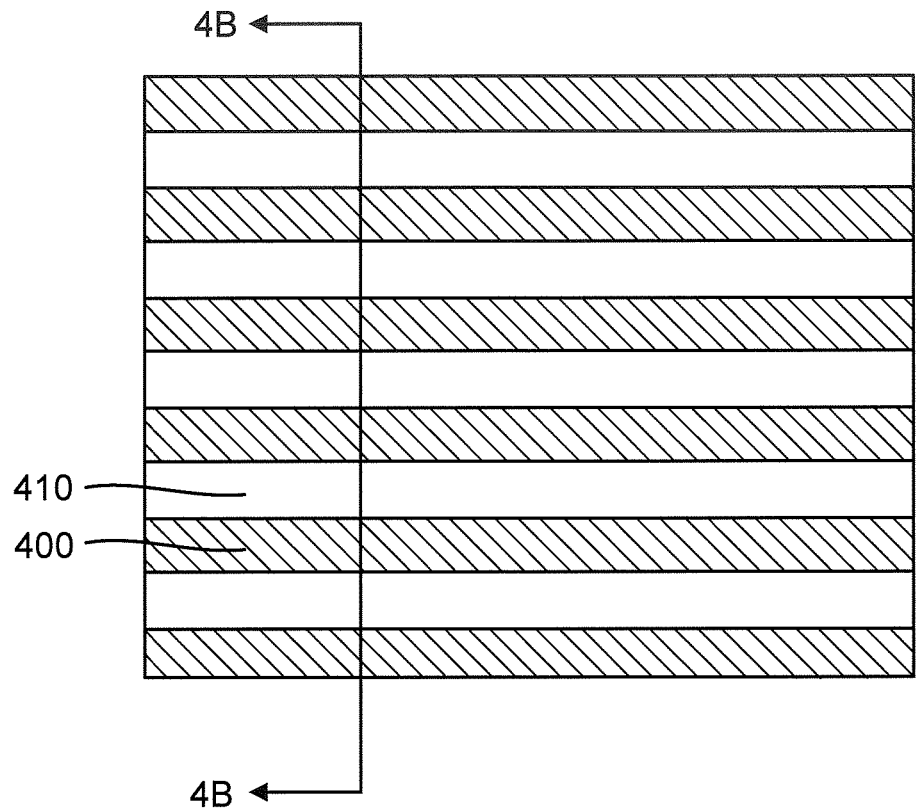
Figure 4B:
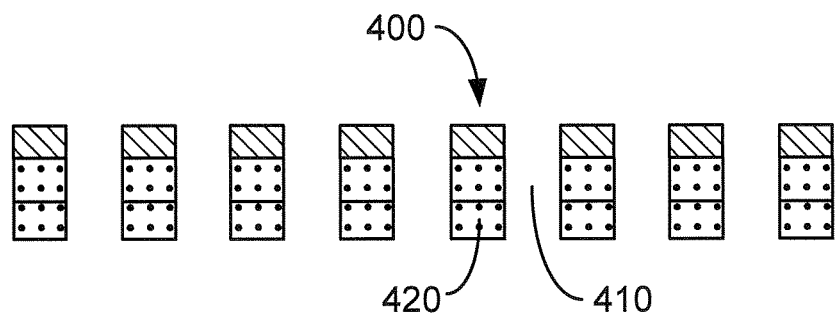

Next, the multi-layer structure 300 illustrated in FIGS. 3A-3B is patterned, resulting in the structure illustrated in FIGS. 4A-4B having a plurality of strips 400 extending in parallel in a first direction and defining first trenches 410 between the strips 400. The strips 400 include word lines 420 comprising a portion of the first doped semiconductor layer 310.

Figure 5A:
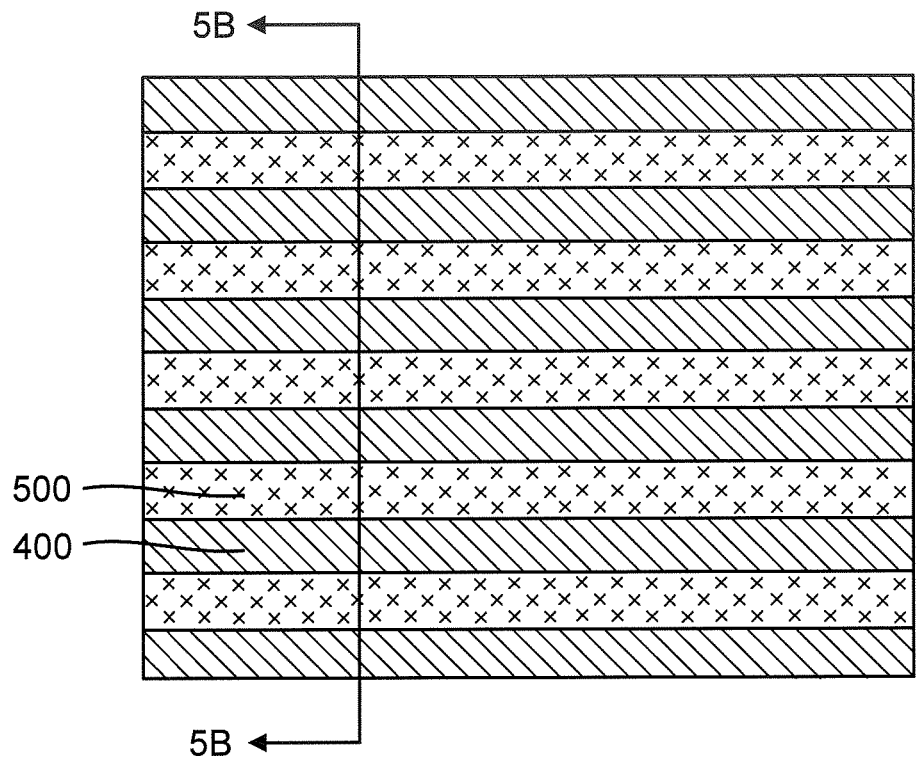
Figure 5B:
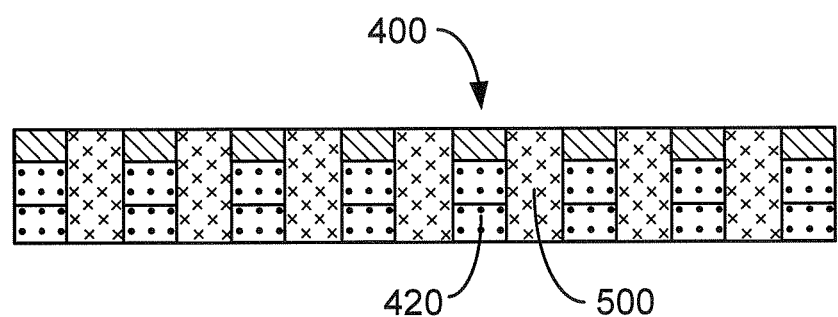

Next, a first dielectric material 500 is formed in the first trenches 410 of the structure illustrated in FIGS. 4A-4B and planarized, using for example chemical mechanical polishing CMP, resulting in the structure illustrated in FIGS. 5A-5B. The first dielectric material 500 can comprise, for example, silicon dioxide.

Figure 6A:
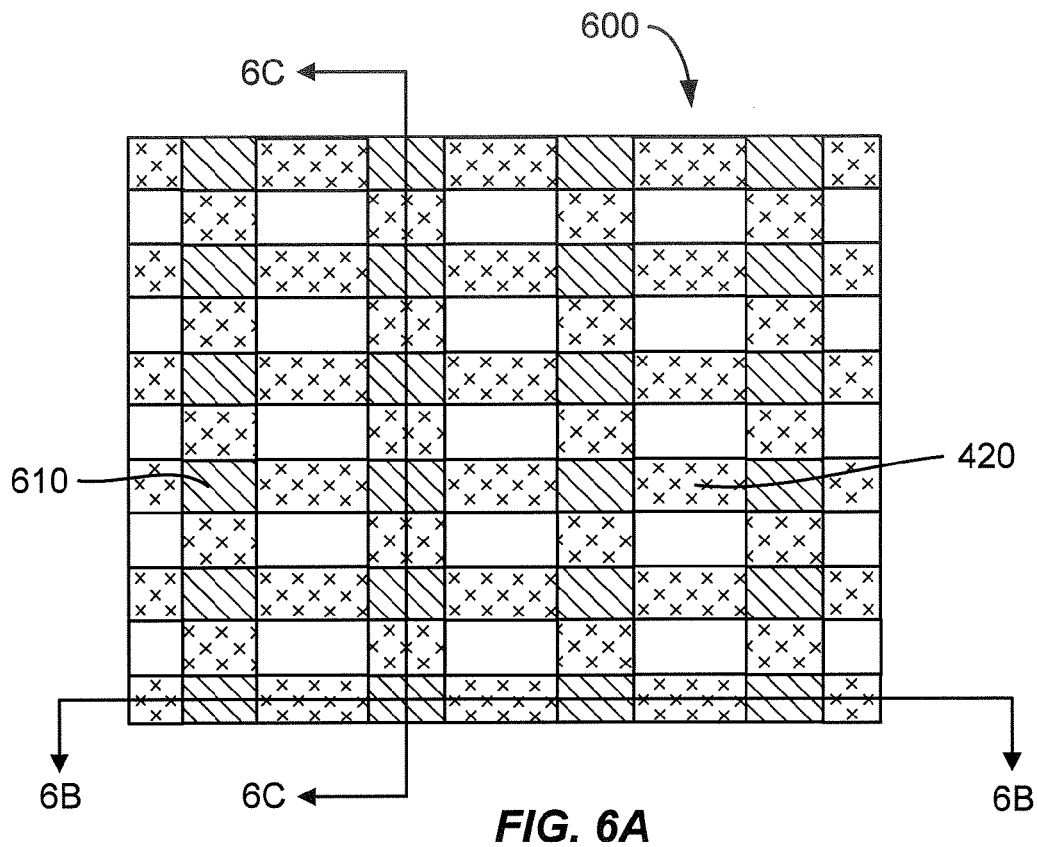
Figure 6B:
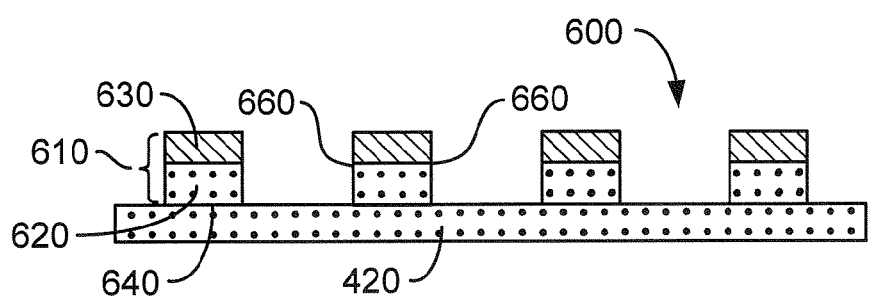
Figure 6C:
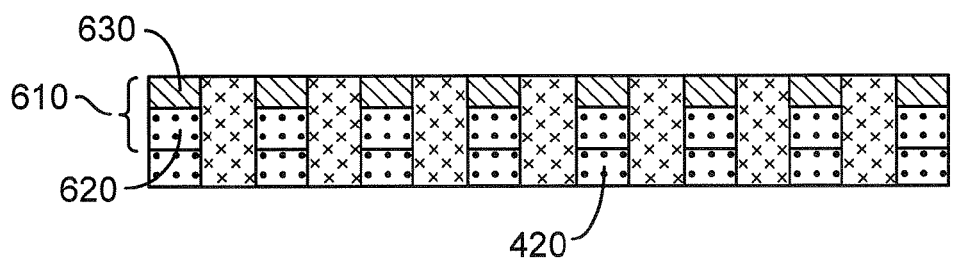

Next, a plurality of second trenches 600 are formed by etching the structure illustrated in FIGS. 5A-5B, resulting in the structure illustrated in FIGS. 6A-6C having a plurality of multi-layer stacks 610 between the second trenches 600. The second trenches 600 extend in parallel in a second direction perpendicular to the first direction. As can be seen in FIGS. 6A-6C, the portions of the wordlines 420 beneath the trenches 600 are exposed. The multi-layer stacks 610 include a second doped region 620 and a first electrode 630. The second doped region 620 comprises a portion of the second doped semiconductor region 320 on the corresponding word line 420 and defines a pn junction 640 therebetween. The first electrode 630 comprises the bottom electrode layer 330 on the corresponding second doped region 620. The multi-layer stacks 610 have sidewall surfaces 660.

Figure 7A:
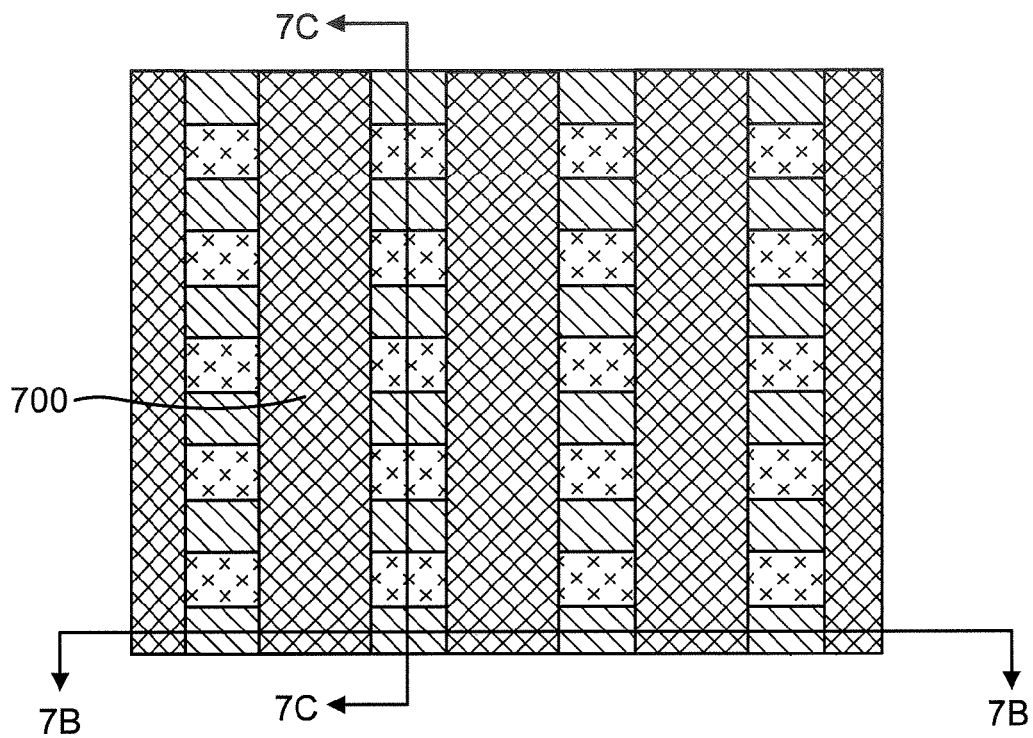
Figure 7B:
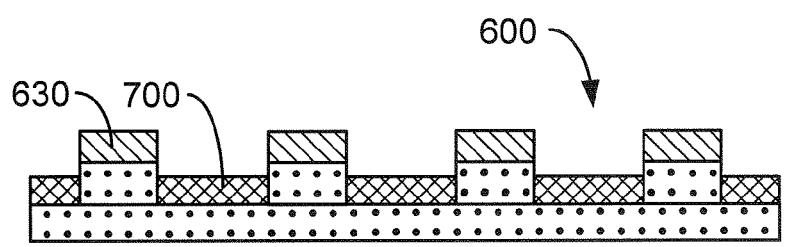
Figure 7C:
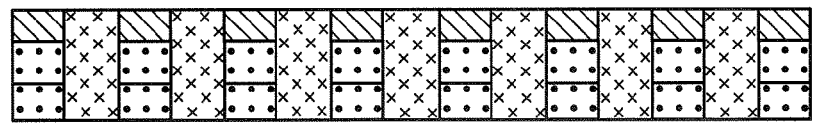

Next, a second dielectric material 700 is formed in the trenches 600 of FIGS. 6A-6C, the second dielectric material 700 partially filling the trenches 600 and resulting in the structure illustrated in FIGS. 7A-7C. The second dielectric material 700 can be formed for example, by filling the trenches 600 with dielectric material 700 and selectively etching back the dielectric material 700.

Figure 8A:
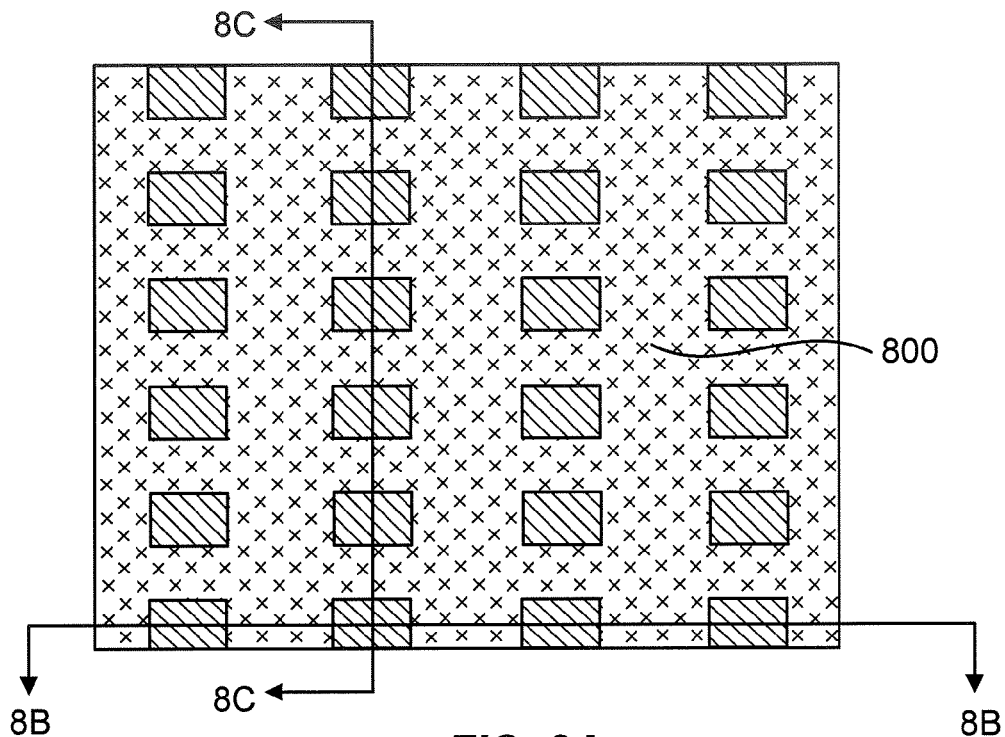
Figure 8B:
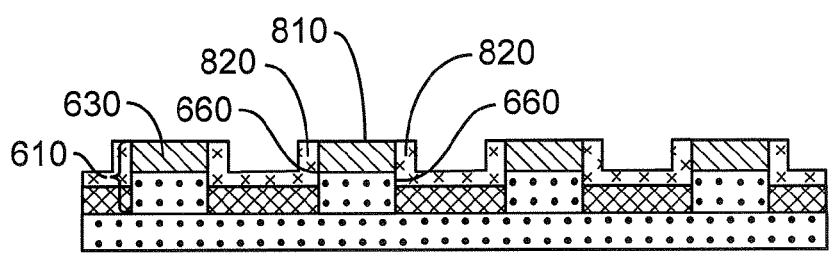
Figure 8C:
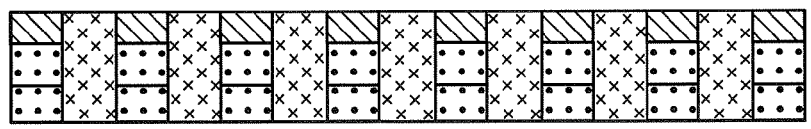

Next, a conformal layer of a third dielectric material is formed on the structure illustrated in FIGS. 7A-7C and planarized, using for example CMP, to expose the top surface 810 of the multi-layer stack 610, resulting in the structure illustrated in FIGS. 8A-8C having insulating members 820 on the sidewalls 660 of the stacks 610. As can been seen in FIG. 8B, pairs of insulating members 820 are between adjacent first electrodes 630.

Figure 9A:
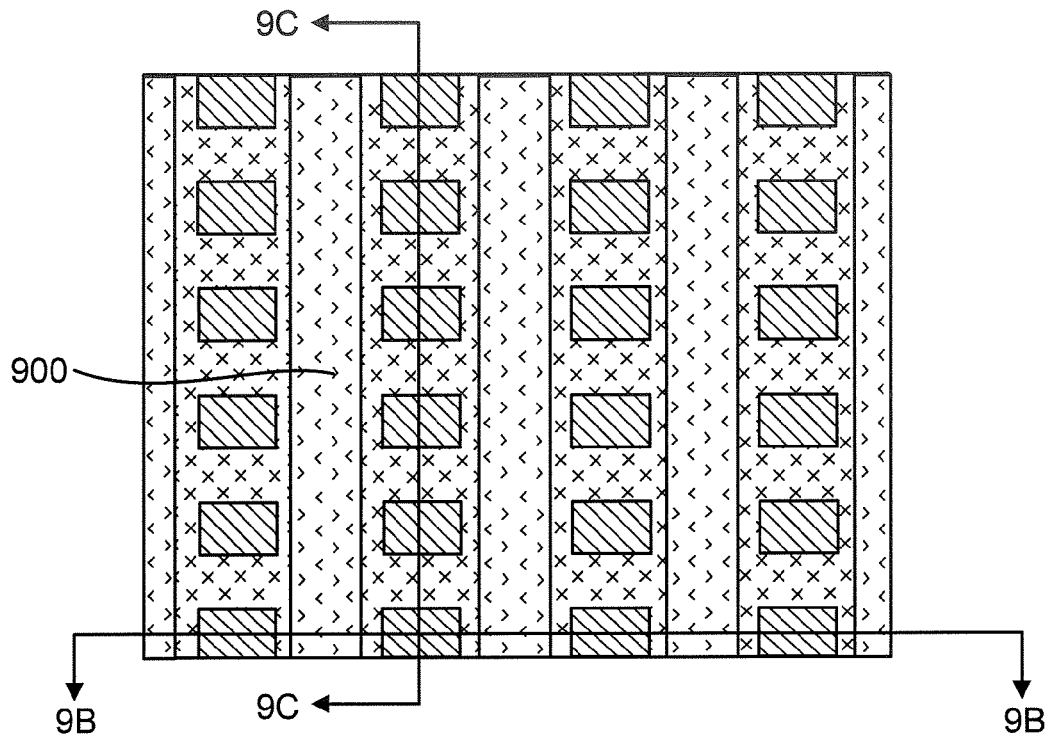
Figure 9B:
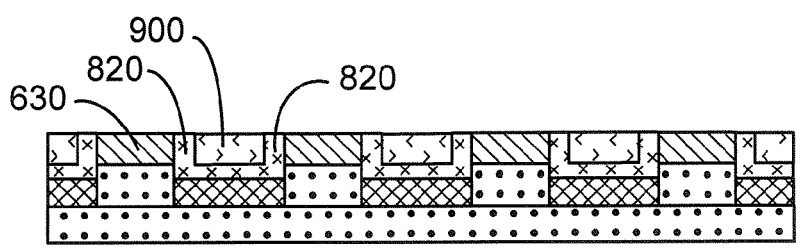
Figure 9C:
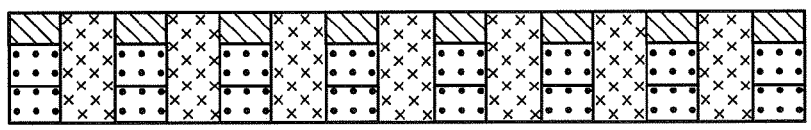
Figure 10A:
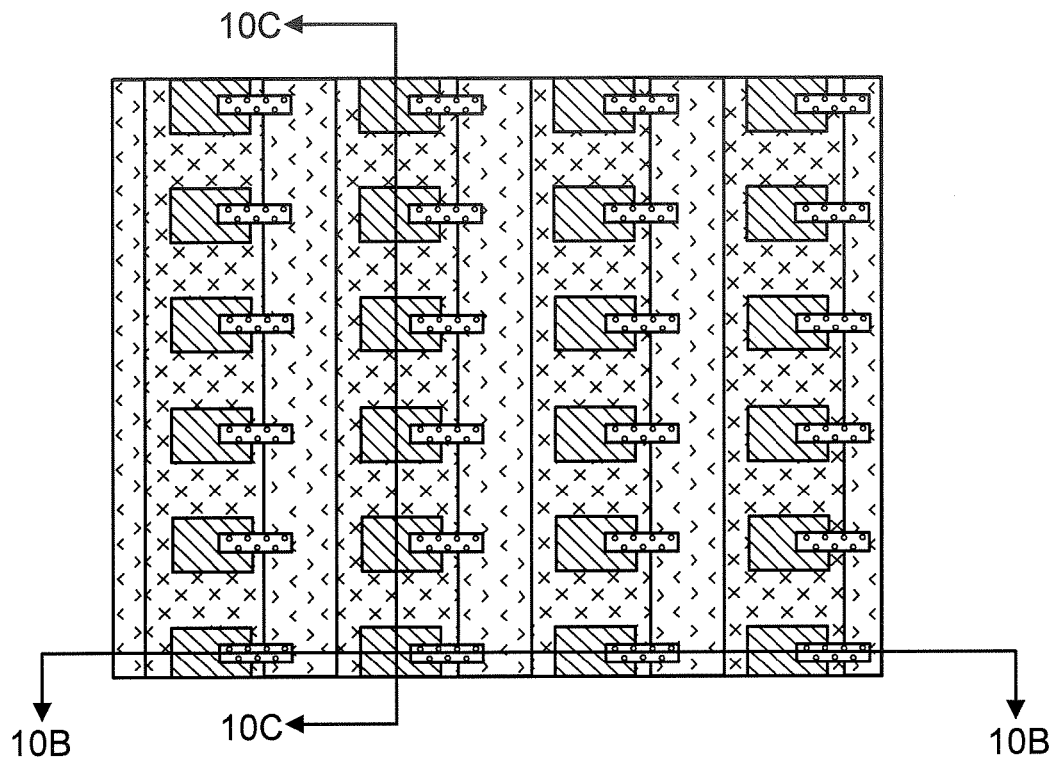
Figure 10B:
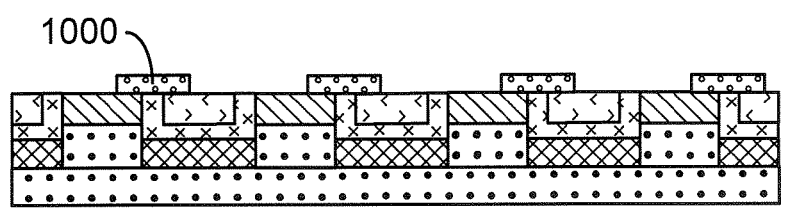
Figure 10C:
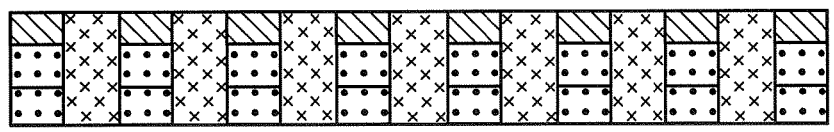

Next, a layer of conductive material is formed on the structure illustrated in FIGS. 8A-8C and planarized, using for example CMP, resulting in the structure illustrated in FIGS. 9A-9C having bit lines 900 extending in parallel in the second direction, the bit lines 900 between pairs of insulating members 820. Next, a layer of phase change material is patterned to form a plurality of phase change bridges 1000 as illustrated in FIGS. 10A-10C, resulting in the array of memory cells as illustrated in FIGS. 2A-2D. Alternatively, the phase change bridges 1000 may be formed, for example, by patterning a layer of dielectric material over the structure illustrated in FIGS. 9A-9C and using that layer of dielectric material as a mask for forming the phase change bridges 1000.

An embodiment of an array of memory cells as described herein include a plurality of word lines comprising doped semiconductor material having a first conductivity type, the word lines having word line widths and extending in parallel in a first direction. A plurality of second doped semiconductor regions having a second conductivity type opposite the first conductivity type, second doped semiconductor regions in the plurality of second doped semiconductor regions on corresponding word lines and defining respective pn junctions therebetween. A plurality of electrode pairs, wherein pairs include respective first and second electrodes and an insulating member between the first and second electrodes, the insulating member having a thickness between the first and second electrodes, the first electrodes on corresponding second doped semiconductor regions. An array of bridges of memory material across the insulating members of respective electrode pairs, the bridges having respective bottom surfaces and contacting the first and second electrodes in the respective electrode pairs on the bottom surface, and defining an inter-electrode path between the corresponding first and second electrodes defined by the thickness of the insulating member, wherein the memory material has at least two solid phases.

Advantages of an embodiment described herein include memory cells having reduced cell sizes, providing an array architecture supporting high-density devices, and a method for manufacturing such structure that meets tight process variation specifications needed for large-scale memory devices.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

What is claimed is:

1. A memory device comprising:
    a word line extending in a first direction, the word line having a first conductivity type;
    a plurality of pillars on the word line;
    each said pillar comprising a doped semiconductor element having a second conductivity type and a first electrode, the doped semiconductor element contacting the word line to create a PN junction therebetween;
    an insulator extending in a second direction orthogonal to the word line, the insulator positioned between and separating first and second pillars, the first and second pillars being adjacent pillars;
    the insulator having first and second sidewalls defining a recess therebetween, the first sidewall opposite the first pillar and the second sidewall opposite the second pillar;
    a second electrode in the recess;
    a memory element positioned external of the recess and over one of the two sidewalls, the memory element electrically connecting the first and second electrodes, wherein the memory element has at least two solid phases, the at least two solid phases being reversibly inducible by a current.

2. The device of claim 1, wherein the at least two solid phases include a generally amorphous phase and a generally crystalline phase.

3. The device of claim 1, wherein the thickness of the insulator is less than a minimum lithographic feature size for a lithographic process used to form the device.

4. The device of claim 1, wherein the memory element comprises an alloy including a combination of Ge, Sb, and Te.

5. The device of claim 1, wherein the memory element comprises an alloy including a combination of two or more materials from the group of Ge, Sb, Te, Se, In, Ti, Ga, Bi, Sn, Cu, Pd, Pb, Ag, S, and Au.

6. The device of claim 1, wherein the first conductivity type comprises N-type conductivity and the second conductivity type comprises P-type conductivity.

7. The device of claim 1, wherein the first and second electrodes comprise an element selected from a group consisting of Ti, W, Mo, Al, Ta, Cu, Pt, Ir, La, Ni, and Ru and alloys thereof.

8. The device of claim 1, wherein the first and second electrodes comprise Ti and N.

9. The device of claim 1, wherein the first and second electrodes comprise Ta and N.

10. The memory device of claim 1, wherein the memory element comprises an active region spaced apart from the first electrode and the second electrode.

11. The memory device of claim 1, wherein the memory element comprises an active region overlying the insulator.

12. The memory device of claim 1, wherein the memory element comprises an active region spaced apart from the first and second electrodes and overlying the insulator.

13. The memory device according to claim 1, wherein the first and second electrodes have coplanar upper surfaces, a bottom surface of the memory element contacting the upper surfaces.

14. The memory device according to claim 1, wherein the memory element defines an inter-electrode current path between the first and second electrodes and across one of the two sidewalls, the inter-electrode current path having a path length defined by the thickness of the one of the two sidewalls.

15. The memory device according to claim 1, wherein the second electrode acts as a bit line.

16. An array of memory cells comprising:
   a plurality of word lines extending in a first direction, the word lines having a first conductivity type;
   a plurality of pillars on and spaced apart along at least some of the word lines;
   each pillar comprising a doped semiconductor element having a second conductivity type and a first electrode, the doped semiconductor elements contacting the word lines to create PN junctions therebetween;
   a plurality of U-shaped insulating members oriented in a second direction orthogonal to the first direction, each insulating member located between pairs of the pillars and having a first and second sidewalls defining a recess therebetween, the first and second sidewalls against first and second pillars of the pair of the pillars;
   a plurality of bit lines within the plurality of recesses of the U-shaped insulating members; and
   a plurality of memory elements positioned external of the recesses, over the first sidewalls and electrically connecting pairs of bit lines and first electrodes on opposite sides of the first sidewalls, wherein the memory elements have at least two solid phases, and the at least two solid phases are reversibly inducible by a current.

17. The array of memory cells of claim 16, wherein the memory cells are arranged in a cross point array.

18. The array of memory cells of claim 17, wherein the bit lines have bit line widths.

19. The array of memory cells of claim 18, further comprising:
   adjacent bit lines in the plurality of the bit lines being separated by a first separation distance;
   adjacent word lines in the plurality of word lines being separated by a second separation distance; and
   memory cells in the array of memory cells having a memory cell area, the memory cell area having a first side along the first direction and a second side along the second direction, the second side having a length equal to the word line width and the second separation distance, and the first side having a length equal to the bit line width and the first separation distance.

20. The array of memory cells of claim 19, wherein the first side length is equal to twice a feature size F, and the second side is equal to twice a feature size F, such that the memory cell area is equal to about $4F^2$.

21. The array of memory cells of claim 16, wherein the at least two solid phases include a generally amorphous phase and a generally crystalline phase.

22. The array of memory cells of claim 16, wherein the thickness of the insulating members is less than a minimum lithographic feature size for a lithographic process used to form the array.

23. The array of memory cells of claim 16, wherein the memory elements comprise an alloy including a combination of Ge, Sb, and Te.

24. The array of memory cells of claim 16, wherein the memory elements comprise an alloy including a combination of two or more materials from the group of Ge, Sb, Te, Se, In, Ti, Ga, Bi, Sn, Cu, Pd, Pb, Ag, S, and Au.

25. The array of memory cells of claim 16, wherein the first conductivity type comprises N-type conductivity and the second conductivity type comprises P-type conductivity.

26. The array of memory cells of claim 16, wherein the first electrodes and the bit lines comprise an element chosen from a group consisting of Ti, W, Mo, Al, Ta, Cu, Pt, Ir, La, Ni, and Ru and alloys thereof.

27. The array of memory cells of claim 16, wherein the memory elements have bottom surfaces, the pairs of bit lines and first electrodes having coplanar upper surfaces, the bottom surfaces contacting the upper surfaces.

* * * * *